(12) United States Patent  
Clemons et al.

(10) Patent No.: US 7,275,312 B2  
(45) Date of Patent: Oct. 2, 2007

(54) APPARATUS FOR PRECISE ALIGNMENT OF PACKAGING CAPS ON A SUBSTRATE

(75) Inventors: Gregory S. Clemons, Chandler, AZ (US); Mitesh C. Patel, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 303 days.

(21) Appl. No.: 10/611,215

(22) Filed: Jun. 30, 2003

(65) Prior Publication Data

US 2004/0261262 A1  Dec. 30, 2004

(51) Int. Cl.  
*B23P 18/00* (2006.01)

(52) U.S. Cl. .......................... 29/740; 29/757; 29/759; 29/760; 29/834; 53/477; 156/69; 257/684; 257/731; 438/118

(58) Field of Classification Search ................. 29/715, 29/717–721, 739–741, 743, 744, 832, 834, 29/757, 759–761; 53/329.3, 432, 476–478, 53/88, 246; 156/69, 230, 233, 234; 438/106, 438/118, 125; 257/684–685, 717, 731; 347/54  
See application file for complete search history.

(56) References Cited

U.S. PATENT DOCUMENTS

| | | | | |
|---|---|---|---|---|
| 4,870,800 A | * | 10/1989 | Kasai | 53/88 |
| 4,907,065 A | * | 3/1990 | Sahakian | 257/684 |
| 5,056,296 A | * | 10/1991 | Ross et al. | 29/743 |
| 5,332,463 A | * | 7/1994 | Eberlein et al. | 29/740 |
| 5,801,074 A | * | 9/1998 | Kim et al. | 438/125 |
| 6,112,795 A | * | 9/2000 | Emmett et al. | 156/556 |
| 6,409,859 B1 | * | 6/2002 | Chung | 156/69 |
| 6,557,978 B2 | * | 5/2003 | Silverbrook | 347/54 |
| 6,893,574 B2 | * | 5/2005 | Felton et al. | 438/113 |

* cited by examiner

*Primary Examiner*—Minh Trinh  
*Assistant Examiner*—Donghai D. Nguyen  
(74) *Attorney, Agent, or Firm*—Blakely, Sokoloff, Taylor & Zafman LLP

(57) ABSTRACT

The specification discloses an apparatus comprising an alignment plate having a plurality of depressions therein, each depression being sized to receive a packaging cap therein and to prevent its movement, and a force applicator to apply a force to press the packaging caps and a substrate firmly together. Also disclosed is a process comprising inserting a plurality of packaging caps in a plurality of depressions on an alignment plate, each depression being sized to receive a packaging cap and prevent its movement, aligning the plurality of packaging caps with individual devices on a substrate, placing the substrate in contact with the packaging caps, and applying a force to press the caps against the substrate. Other embodiments are disclosed and claimed.

27 Claims, 6 Drawing Sheets

APPARATUS FOR PRECISE ALIGNMENT OF PACKAGING CAPS ON A SUBSTRATE

TECHNICAL FIELD

The present invention relates generally to device packaging and in particular, but not exclusively, to the precise alignment of caps for packaging devices built on a substrate.

BACKGROUND

FIG. 1 illustrates a wafer (or substrate) 102 having a plurality of devices built thereon. The devices 104 can be microelectromechanical systems (MEMS), microprocessors, memory chips, or other types of integrated circuits and/or mechanical features. For certain devices 104, such as MEMS, it is desirable to package the devices in a hermetic sealed enclosure to protect them from environmental contamination.

FIGS. 2A-2D illustrate one approach that has been tried for individually packaging the devices 104 in a sealed enclosure. When the devices 104 on the wafer 102 are completed, the individual devices 104 are cut from the wafer by sawing along the "streets" between devices 104, a process known as "singulation." After singulation, each individual device 104 becomes a packaged device 200 by placing a packaging cap 202 over the device 104 and then thermally reflowing the cap to the substrate 102 to ensure the cap is sealed. Reflowing usually involves placing the device 200 as shown into an oven, microwave, or similar heating device so that a bead of sealant will melt or react to form a hermetic seal with the substrate. The bead of sealant is applied to the perimeter of the packaging cap or comes pre-applied to the perimeter before the cap 202 is put over the device 104.

This approach for packaging individual devices has various shortcomings. Most notably, surface tension in the sealant during reflow causes the packaging cap 202 to either rotate as shown in FIG. 2C, translate as shown in FIG. 2D, or both. If the packaging cap 202 rotates or translates too much, it will no longer cover the desired area of the device 104, and indeed may damage the device. On top of these disadvantages, individually packaging each device requires multiple operations and is therefore time consuming and costly.

Attempts have been made to overcome the disadvantages of individually packaging devices 104 by shifting to wafer-level, matrix-array, or large-area substrate packaging. In current wafer-level packaging techniques, packaging caps are simultaneously placed on all the devices 104 on a single wafer 102, and then the entire wafer is heated to reflow all the packaging caps onto the wafer at once. After all the packaging caps are attached to the wafer, the individual sealed devices are singulated from the wafer. While these wafer-level packaging techniques involve fewer operations, they suffer from some of the same disadvantages as individual packaging of devices. If no restraining force is provided for the packaging caps during reflow, they still rotate and translate as shown in FIGS. 2C and 2D. The rotation and translation of the caps can damage the devices 104, and when rotation and translation occur at the wafer or substrate level they can interfere with proper singulation of the devices 104. This can render the device or even the entire wafer useless. While several attempts have been made to overcome the problems of current wafer-level packaging techniques, these have either not solved the problem or have led to other subsequent problems. For example, another approach is to reflow the packaging caps while providing a force to press each cap into the substrate to prevent its movement. However, this method has led to wafer cracking because of the stress concentrations caused where the caps meet the substrate.

BRIEF DESCRIPTION OF THE DRAWINGS

Non-limiting and non-exhaustive embodiments of the present invention are described with reference to the figures, which are not to scale unless so noted. In all figures, like reference numerals refer to like parts throughout the various views unless otherwise specified.

DETAILED DESCRIPTION OF THE ILLUSTRATED EMBODIMENTS

Embodiments of an apparatus and method for accurate alignment and placement of packaging caps on a substrate are described herein. In the following description, numerous specific details are described to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 1:
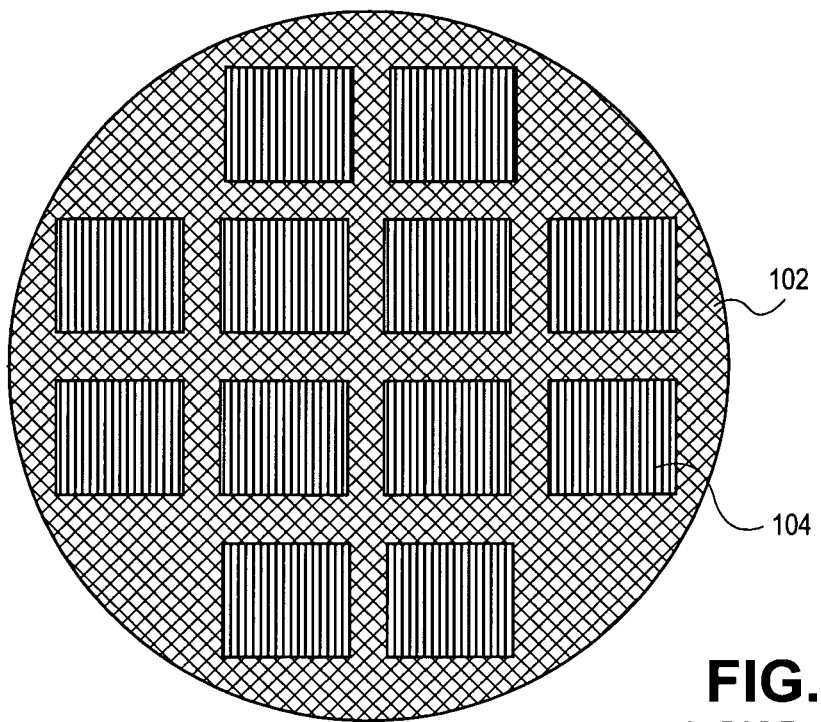
FIG. 1 is a plan view of a wafer having a plurality of devices built thereon.
Figure 2A:
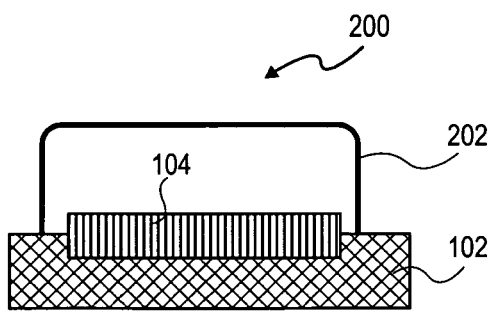
FIG. 2A is a side elevation of a device on a wafer hermetically sealed in a package cap.
Figure 2B:
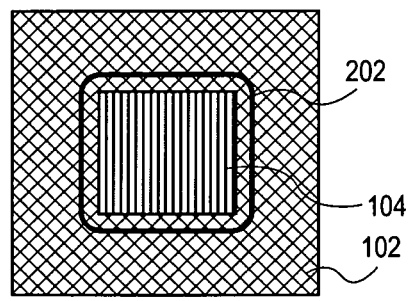
FIG. 2B is a top view of a device on a wafer hermetically sealed in a package cap.
Figure 2C:
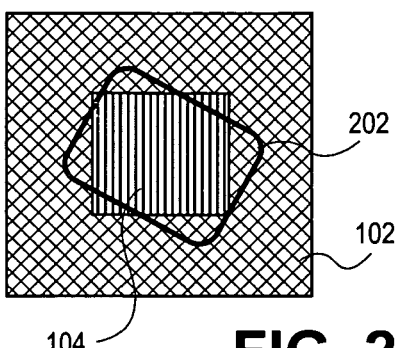
FIG. 2C is a top view of a device on a wafer showing rotation of a package cap during processing.
Figure 2D:
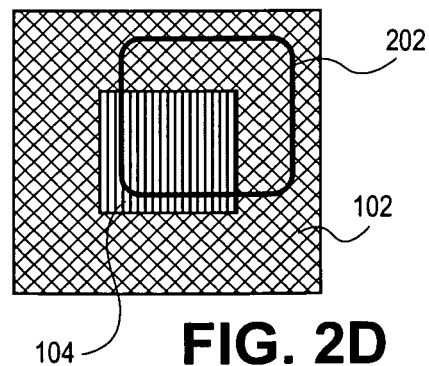
FIG. 2D is a top view of a device on a wafer showing translation of a package cap during processing.
Figure 3A:
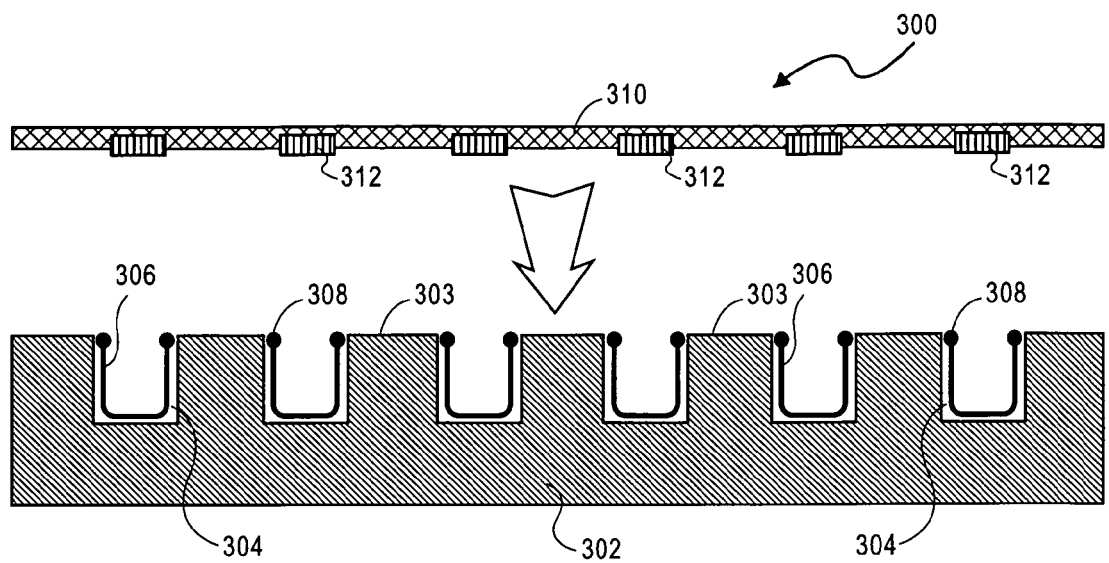
FIGS. 3A-3C are drawings of an embodiment of the present invention.
Figure 3B:
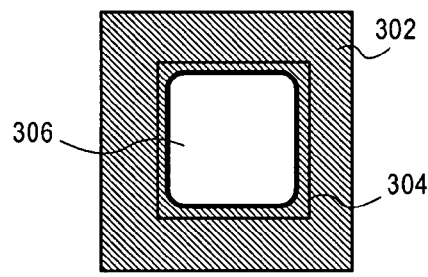
Figure 3C:
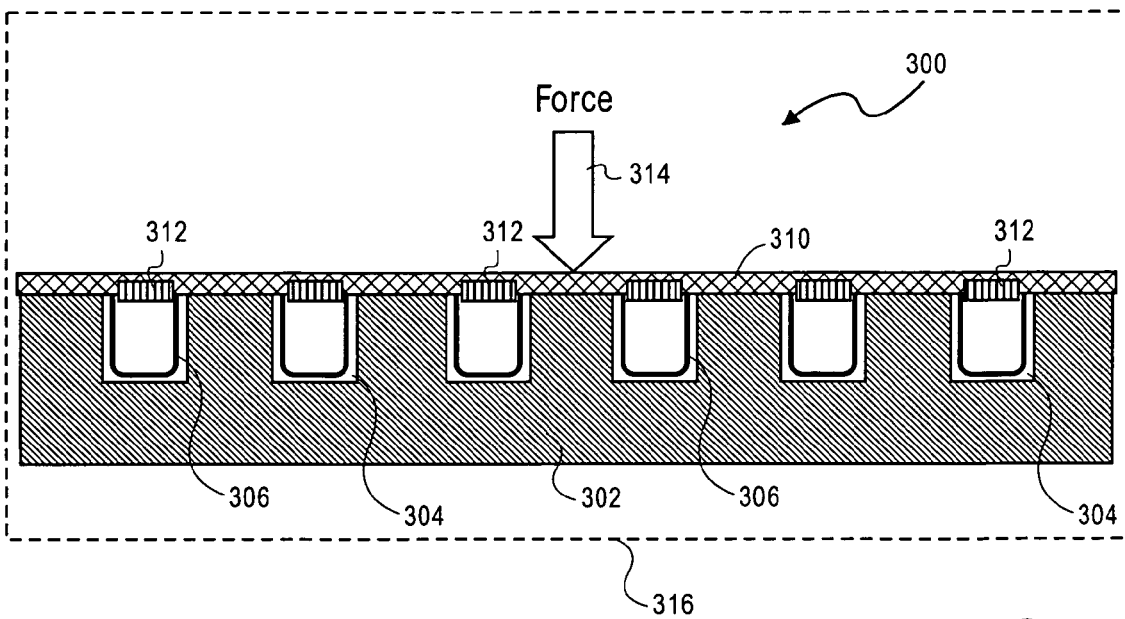

FIGS. 3A-3C illustrate an embodiment of an apparatus 300 for accurately aligning a plurality of packaging caps and attaching them to a substrate. FIG. 3A illustrates an embodiment of the basic apparatus. The apparatus 300 comprises an alignment plate 302 having a plurality of depressions 304 therein. The depth of each depression 304 is sized to receive a packaging cap 306 therein such that the edges of the caps 306 are substantially aligned with the surface 303 of the alignment plate.

In one embodiment, the overall size of the alignment plate 302 will correspond approximately to the overall size of the substrate 310 to which the packaging caps 306 will be attached. In other embodiments, however, the alignment plate can be larger or smaller than the substrate, or can be sized to receive multiple substrates at once. The configuration of the depressions 304 on the alignment plate will generally correspond to the configuration of the devices 312 on the substrate 310. The alignment plate 302 will generally be made using a material whose mechanical and thermal properties, such as the coefficient of thermal expansion, give it the necessary dimensional stability. In some cases, the materials used for the alignment plate 302 will be chosen so that its properties are suitably matched or mismatched to the properties of the materials used for the packaging caps 306. In one embodiment, the alignment plate 302 can be machined from a metal such as KOVAR®, an Iron-Cobalt-Nickel (Fe—Co—Ni) alloy manufactured and sold by the Westinghouse Electric Corporation; one embodiment of KOVAR® contains approximately 54% Iron, 27% Cobalt and 19% Nickel and has a coefficient of thermal expansion of about 4.9 ppm/° C. Other embodiments of the alignment plate 302 can be made using non-metallic materials such as ceramic or ceramic-like materials. A ceramic alignment plate will generally have closer tolerances and better stability and polarity, but is generally more difficult and expensive to manufacture than a machined metal alignment plate because it involves more expensive procedures such as tape casting or hot isostatic pressing.

The packaging caps 306 have an open end and a closed end and are generally made of a material with physical properties compatible with those of the substrate and with the processing requirements for packaging. In one embodiment, the packaging caps can be made using ceramic or ceramic-like materials, although in other embodiments different materials can be used. When the packaging caps 306 are inserted in the depressions 304, a bead of sealant 308 is placed around the perimeter of the open ends of the caps, so that the caps will be hermetically sealed to the substrate after reflowing (see below). The bead of sealant can be placed on the edges of the caps before or after insertion of the caps into the depressions 304. In one embodiment the sealant 308 can be frit glass, although in other embodiments the sealant can be a different material such as a solder, so long as the sealant 308 is capable of making and maintaining a seal at the operating conditions of the devices.

The substrate 310 can be any kind of substrate having devices 312 attached thereto. In one embodiment, the substrate 310 is a silicon wafer and the devices 312 can be microprocessors, memories, microelectromechanical (MEMS) systems, etc. As used herein, the word 'wafer' refers to any substrate upon which packaging caps are placed, including without limitation silicon wafers, organic substrates, or inorganic substrates used in electronic packaging and assembly. Thus, in other embodiments the substrate could be something different than a wafer; for example, the substrate 310 could be a printed circuit board and the devices 312 could be dies attached thereto.

FIG. 3B illustrates a top view of a cap 306 inserted in a depression 304 in the alignment plate 302. The length and width of each depression 304 are closely matched to the length and width of the packaging caps 306, so that the cap's motion when in the depression (e.g., its translation or rotation) is prevented or held within a certain tolerance. Generally the depressions 304 should hold the packaging so that they can translate less than the tolerance limits; for example, a few millimeters, microns, and/or a rotation angle less that 1 or 2 degrees. In one embodiment, the dimensions of the depressions 304 and the packaging caps 306 can be chosen, and the coefficients of thermal expansion of the packaging caps 306 and the plate 302 appropriately mismatched, so that upon heating of the alignment plate during reflow the relative expansions of the packaging caps 306 and the plate 302 cause the dimensions of the depressions 304 and the packaging caps 306 to become equal (i.e., cause there to be an interference fit between the cap and depression), such that all movement of the caps is prevented.

FIG. 3C illustrates the operation of the apparatus 300. After the required number of packaging caps 306 are inserted in the depressions 304 in the proper configuration, the substrate 310 is aligned so that the caps 306 will fit over the devices 312 and is placed on the surface 303 of the alignment plate 302. When the substrate 310 is on the alignment plate 302, it is in contact with the edges of the caps and the sealant thereon, as well as with the interstitial portions (i.e., the portions between the depressions) of the top surface 303 of the alignment plate. The substrate 310 is therefore fully supported and is unlikely to bend or crack when the force 314 is applied. When the substrate 310 is properly positioned on the alignment plate 302, a force 314 is applied to push the packaging caps firmly against the surface of the substrate; as described below in connection with other embodiments, there are several ways in which the force 314 can be applied. Once the force 314 is applied, the entire assembly is placed inside an oven 316 to reflow the packaging caps onto the substrate. The oven 316 can be any kind of heater that can raise the temperature of the apparatus 300 to the required temperature, including a conventional thermal oven or an autoclave, or a microwave, ultraviolet (UV), or infrared oven. The temperature inside the oven is brought to a temperature range at, near, or above the melting point of the sealant 308, which varies with the type of sealant used. With the sealant 308 at a temperature range, near or above its melting point the applied force 314 causes the sealant to bond to the substrate, thus hermetically sealing the packaging caps to the substrate. Note that the application of force 314 and heating of the apparatus in oven 316 need not happen in the order described. In other embodiments, the apparatus 300 can first be placed in the oven 316 and heated, followed by application of the force 314 to the substrate 310. In another embodiment, heating and force application can be done simultaneously.

Figure 4A:
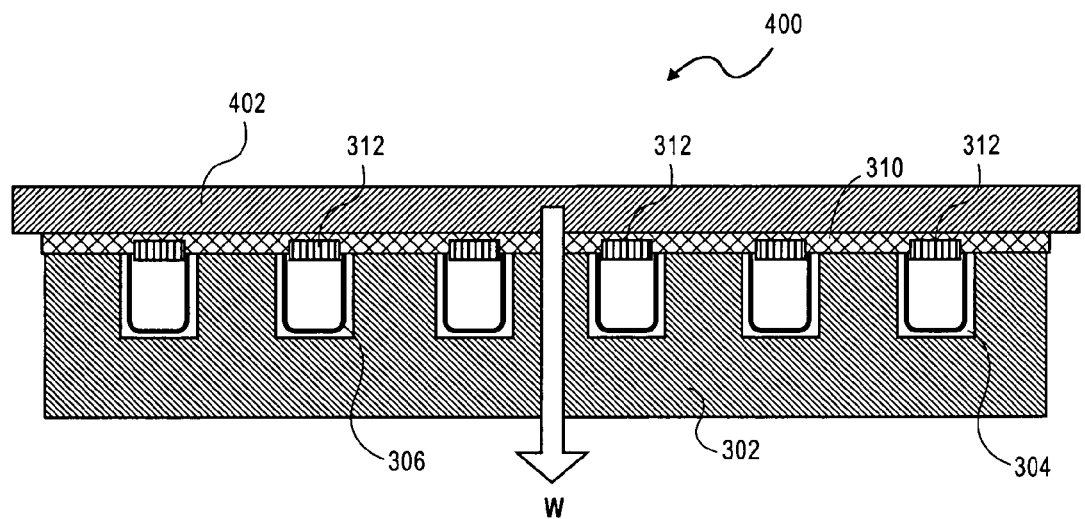
FIGS. 4A-4B are drawings of alternative embodiments of the invention.
Figure 4B:
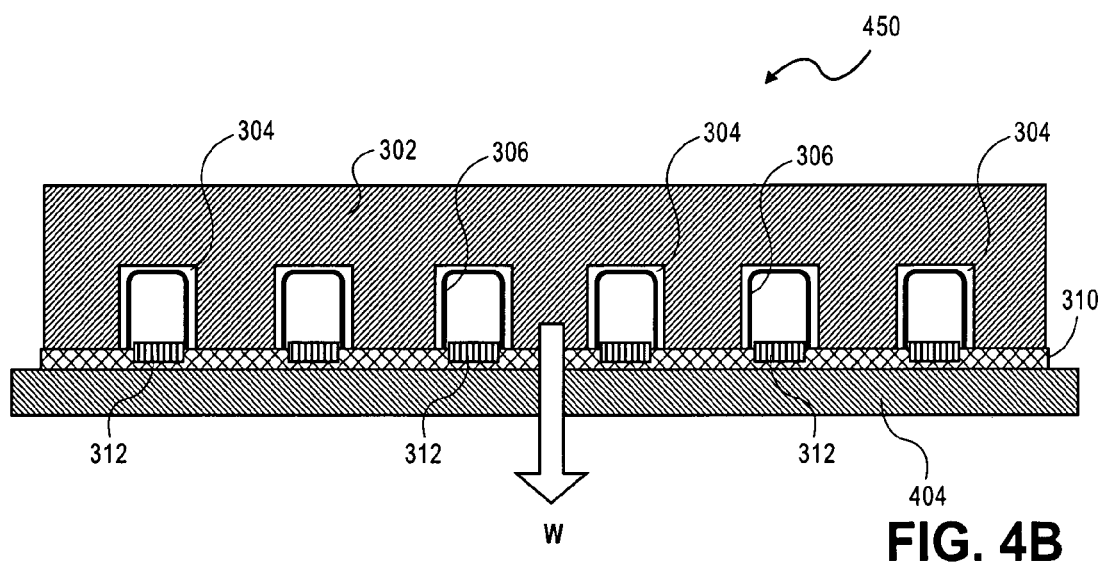

FIGS. 4A-4B illustrate alternative embodiments of an alignment apparatus. FIG. 4A illustrates an alignment apparatus 400 that, similarly to the alignment apparatus 300, includes an alignment plate 302 having a plurality of depressions 304 therein. The depth of each depression 304 is sized to receive a packaging cap 306 therein such that the edges of the caps 306 are substantially aligned with the surface 303 of the alignment plate. The substrate is aligned so that the caps 306 will cover the device 312 and is lowered onto the alignment plate. A cover plate 402 is then placed on top of the substrate 310, sandwiching the substrate between the alignment plate 302 and the cover plate 402. The weight W of the cover plate 402 provides a force that presses the substrate 310 firmly against the packaging caps 306. The entire apparatus 400 is placed in a heating device such as oven 316 (see FIG. 3C) for reflowing.

FIG. 4B illustrates another embodiment of an alignment apparatus 450. The alignment apparatus 450 is similar in construction to the alignment apparatus 400. The principal difference between the apparatus 450 and the apparatus 400 is the orientation of the apparatus. In the apparatus 450, the alignment plate 302 is inverted so that the caps face downward. The substrate 310 is placed on a support 404, and the alignment plate 302 and caps 306 are lowered onto the substrate, thus pressing the caps firmly against the surface of the substrate. As before, the entire apparatus 450 is placed in a heating device such as oven 316 (see FIG. 3C) for reflowing. In the apparatus 450, the force 314 needed for properly reflowing the sealant 308 is provided by the weight W of the alignment plate itself; this is in contrast to the apparatus 400, where the force 314 is provided by the weight of a cover plate 402 that sandwiches the substrate 310 against the alignment plate 302. In both apparatuses, the wafer/substrate would be supported so as no damage would occur as a result of the applied force.

Figure 5A:
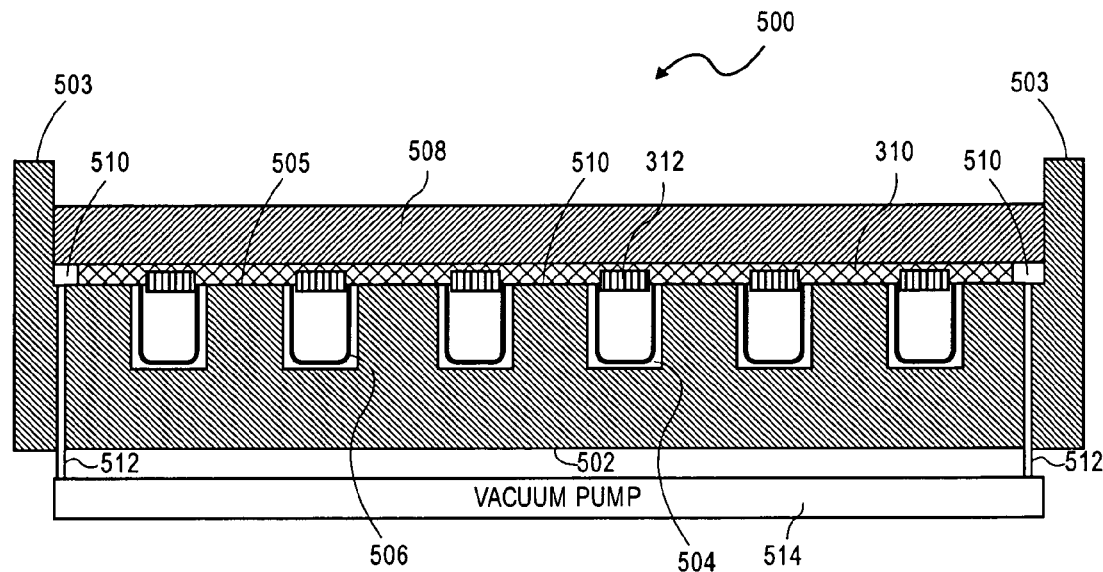
FIGS. 5A-5B are drawings of alternative embodiments of the invention.
Figure 5B:
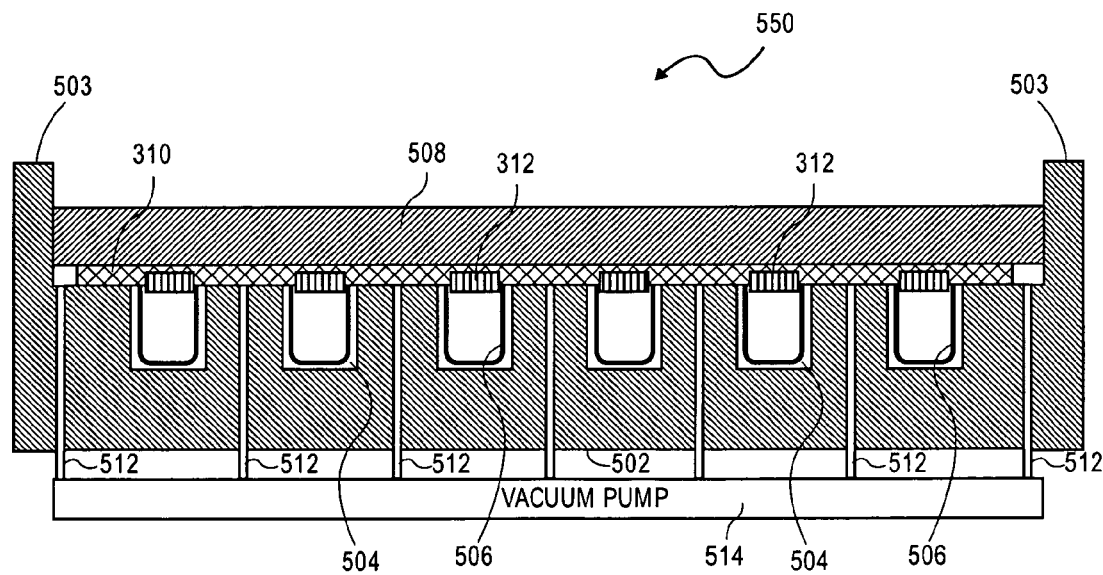

FIGS. 5A-5B illustrate alternative embodiments of an alignment apparatus. FIG. 5A illustrates an alignment apparatus 500 that, similarly to the alignment apparatus 300, includes an alignment plate 502 having a plurality of depressions 504 therein. As in previous embodiments, the depth of each depression 504 is sized to receive a packaging cap 506 therein such that the edges of the caps 506 are substantially aligned with the surface 505 of the alignment plate. In contrast to previous embodiments, however, the alignment plate 502 includes a sealing ring 503 around the perimeter of the plate. The shape bounded by the sealing ring 503 is substantially the same shape and size as a sealing plate 508, which fits within the sealing ring and forms an airtight seal therewith. The substrate 310 to which the caps 506 will be attached is sandwiched between the sealing plate 508, the caps 506, and the surface 505 of the alignment plate 502. The substrate 310 can be smaller than the sealing plate 508, so that a small cavity 510 remains around it perimeter. The cavity 510 is connected to a vacuum pump 514 through ports 512. Note that although the ports 512 are shown in the plate, they could equally well be put elsewhere, so long as they connect the cavity 510 to the vacuum pump 514. For example, the ports 512 could also be in the sealing plate 508.

In operation of the apparatus 500, the required number of packaging caps 506 is put into the depressions 504. The substrate 310 is placed on the alignment plate 502 such that it is in contact with the packaging caps 506 and the surface 505 of the alignment plate. Once the substrate 310 is properly positioned, the sealing plate 508 is inserted within the sealing ring 503 and is lowered until the substrate 310 is sandwiched between the sealing plate 508 and the alignment plate 502. The sealing plate forms a seal with the sealing ring 503, so that air can be drawn out of the cavity 510 by the vacuum pump 514. As the air is drawn out of the cavity 510, atmospheric pressure creates a net downward force on the sealing plate 508, which in turn presses the substrate 310 firmly against the surface 505 and the edges of the caps 506. The entire assembly is then placed in an oven 316 (see FIG. 3C) to reflow the sealant on the edges if the packaging caps. Note that the application of force and heating of the apparatus need not happen in the order described. In other embodiments, the apparatus 500 can first be placed in an oven and heated, followed by drawing of a vacuum to apply force to the substrate 310. In another embodiment, the heating and force application can be carried out simultaneously.

FIG. 5B illustrates an alternative embodiment 550 of the apparatus 500. The apparatus 550 is similar to the apparatus 500 in most respects. The primary difference between the apparatus 550 and the apparatus 500 is the addition of more ports 512 in the interstitial portions of the alignment plate. The ports 512 all connect to the vacuum pump 514 to draw air out of the cavity between the sealing plate 508 and the alignment plate 502. The apparatus 550 operates similarly to the apparatus 500.

Figure 6A:
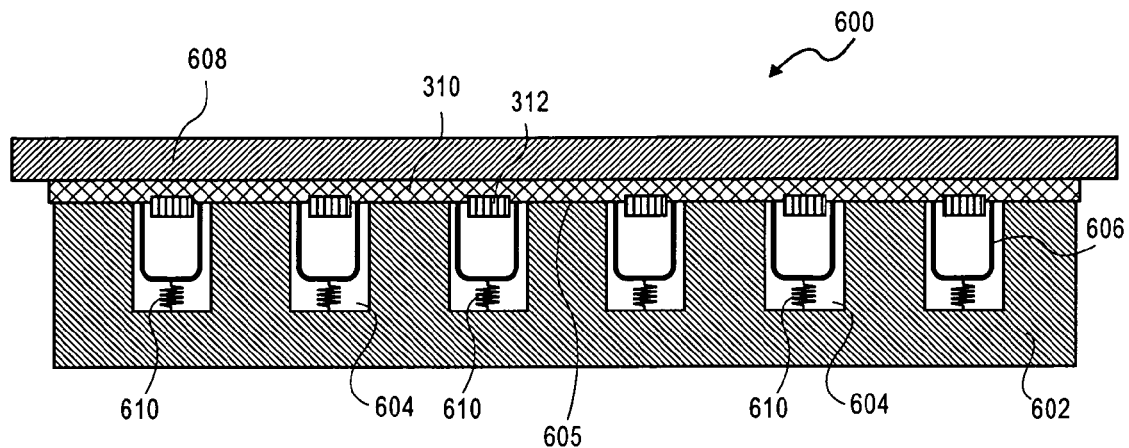
FIGS. 6A-6B are drawings of alternative embodiments of the invention.
Figure 6B:
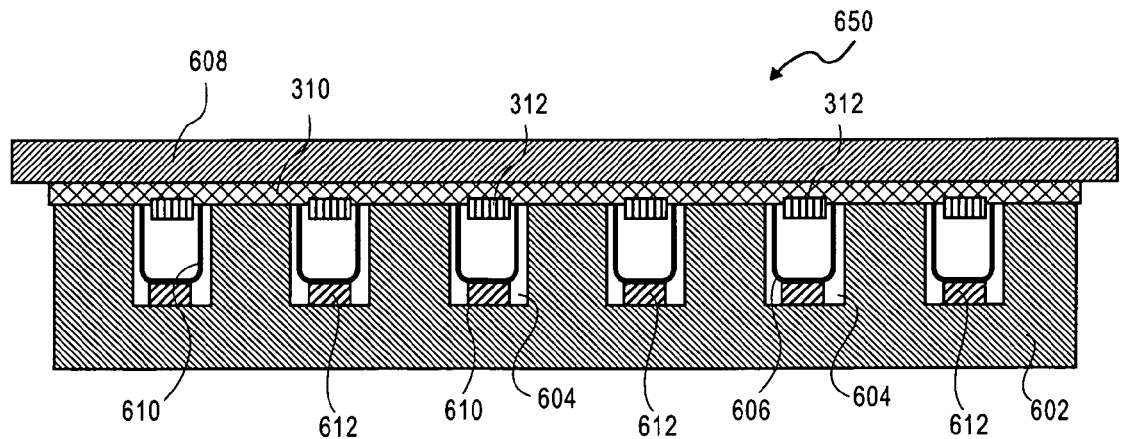

FIGS. 6A-6B illustrate alternative embodiments of an alignment apparatus. FIG. 6A illustrates an apparatus 600 comprising an alignment plate 602 having a plurality of depressions 604 therein. Each depression 604 has a mechanical force applicator such as a spring 610 in the bottom thereof The spring 610 may be a coil spring, a leaf spring, or any other mechanical element that provides a force in relation (linearly or otherwise) to a deflection. The depth of each depression 604 is sized to receive a packaging cap 606 therein such that when the packaging caps rest on the springs 610 the edges of the packaging caps 606 are substantially aligned with or projecting slightly above the surface 605 of the alignment plate. The substrate 310 to which the packaging 606 will be attached is then placed on the alignment plate, and cover plate 608 is placed on top of the substrate 310, sandwiching it between the cover plate 608 and the alignment plate 602. When the cover plate 608 is in place, it presses the substrate 310 against the alignment plate 602, while the force of the springs 610 firmly presses the packaging caps 606 against the substrate. In some cases, it may be necessary to clamp the cover plate to the alignment plate, so that the springs can provide the maximum amount of force to press the caps against the substrate. As with previous embodiments, the entire apparatus 600 is placed in an oven 316 (see FIG. 3C) or other heating source for reflow.

FIG. 6B illustrates an alternative embodiment 650 of the alignment apparatus 600. The alignment apparatus 650 is similar to the apparatus 600. The primary difference between the two is that in the apparatus 650 the springs 610 are replaced by small expansion elements 612 of a material having a suitably chosen coefficient of thermal expansion. The depth of each depression 604 is sized to receive a packaging cap 606 therein such that when the packaging cap rests on the expansion element 610 the edges of the packaging caps 606 are substantially aligned with or project slightly above the surface 605 of the alignment plate. The substrate 310 is placed on the alignment plate, and the cover plate 608 is placed on the substrate 310, sandwiching it between the cover plate 608 and the alignment plate 602. When the cover plate is in place, it presses the substrate 310 against the alignment plate 602 and the packaging caps 606 against the substrate. When the apparatus 650 is heated to complete reflow, the expansion elements 612 expand and firmly press the caps 606 against the substrate. In some cases, it may be necessary to clamp the cover plate to the alignment plate, so that the springs can provide the maximum amount of force to press the caps against the substrate. By using the expansion elements 612, the force applied to the caps has some relationship, linear or otherwise, to the reflow temperature.

Figure 7:
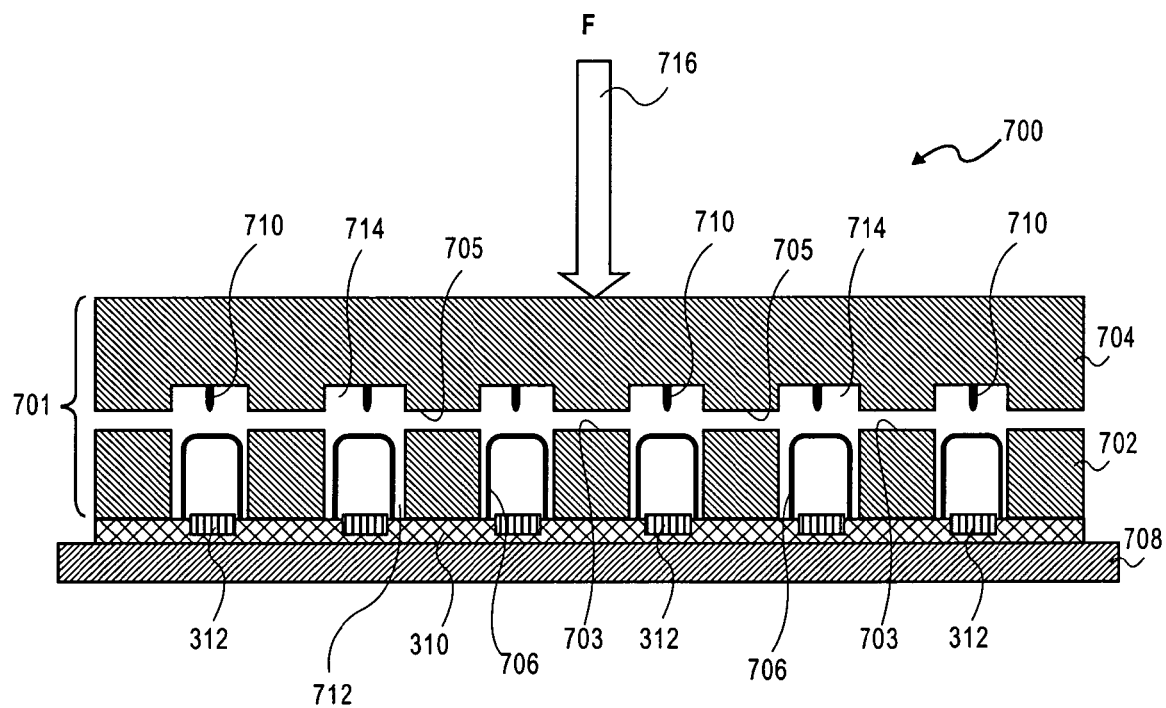
FIG. 7 is a drawing of an alternative embodiment of the invention.

FIG. 7 illustrates an embodiment of an alignment apparatus 700. The alignment apparatus 700 includes a two-part alignment plate 701. The alignment plate 701 comprises an alignment portion 702 and a force application portion 704. The alignment portion 702 has a plurality of holes 712 therein, the depth of the holes 712 being sized so that the holes can receive packaging caps 706 therein. The packaging caps are inserted in the holes 712 such that they project above the surface 703 of the alignment portion 702. The force application portion 704 has a plurality of depressions 714 therein, and the number and position of the depressions in the force application portion 704 correspond to the number and position of the holes 712 in the alignment portion 702. Each depression 714 has a contact element 710 therein, which can be a pin, a block of material, a spring, or some other element capable of transmitting a force to the packaging caps 706 when the force application portion 704 is mated to the alignment portion 702.

In operation of the alignment apparatus 700, a substrate 310 having a plurality of devices 312 thereon is positioned on a support plate 708. A plurality of packaging caps 706 corresponding in number and position to the devices 312 are inserted into the holes 712, and the alignment portion 702 is positioned on the substrate such that the caps 706 are in contact with the substrate 310 and are aligned with their respective devices 312. The depressions 714 in the force application portion 704 are aligned with their corresponding holes 712, and the force application portion 704 is placed on the alignment portion such that the contact elements 710 are in contact with the packaging caps 706. A force 716 is then applied to the force application portion 704 to cause the contact elements 710 to press the packaging caps 706 firmly against the substrate 310. The force 716 can simply be the weight of the force application portion 704, or can include additional applied forces. Force can be applied until the surface 703 of the alignment portion mates with the surface 705 of the force application portion, at which point no further force is applied to the packaging caps 706. After the force is applied to the force application portion 704, the entire apparatus 700 is inserted into a heating device such as an oven 316 (see FIG. 3C) to complete the reflow. Note that the application of force 716 and heating of the apparatus 700 in oven 316 need not happen in the order described. In other embodiments, the apparatus 700 can first be placed in the oven 316 and heated, followed by application of the force 716 to the force application portion 304. In another embodiment, heating and force application can be done simultaneously.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. An apparatus comprising:
an alignment plate having a plurality of depressions separated from each other by interstitial portions of the alignment plate, each depression being sized to receive a packaging cap therein and to prevent movement of the packaging cap; and
a force applicator to press the alignment plate together with a substantially rigid substrate having a plurality of devices mounted thereon such that the packaging caps and the interstitial portions of the alignment plate are in contact with the substrate and such that each packaging cap encloses a corresponding device mounted on the substrate.

2. The apparatus of claim 1 wherein the alignment plate is made of metal.

3. The apparatus of claim 2 wherein the metal is an alloy comprising approximately 54% Iron (Fe), 27% Cobalt (Co) and 19% Nickel (Ni).

4. The apparatus of claim 1 wherein the alignment plate is made of a ceramic.

5. The apparatus of claim 1 wherein the packaging caps have an open end and a closed end, and wherein there is a bead of sealant dispensed along a perimeter of the open end.

6. The apparatus of claim 1 wherein the force applicator comprises a cover plate.

7. The apparatus of claim 1 wherein the force applicator comprises the alignment plate.

8. The apparatus of claim 1 wherein the force applicator comprises:
a sealing plate positioned within a sealing ring and forming an airtight seal therewith, the sealing ring being positioned around a perimeter of the alignment plate, and the substrate being sandwiched between the sealing plate and the alignment plate; and
a vacuum pump to evacuate air from between the sealing plate and the alignment plate.

9. The apparatus of claim 1 wherein the force applicator applies a force dependent on a deflection of the packaging caps.

10. The apparatus of claim 9 wherein the force applicator comprises a plurality of springs positioned in the depressions.

11. The apparatus of claim 1 wherein the force applicator applies a temperature-dependent force.

12. The apparatus of claim 11 wherein the force applicator comprises a plurality of expansion elements positioned in the plurality of depressions, each expansion element having a coefficient of thermal expansion selected to apply a net force to the packaging cap when heated.

13. The apparatus of claim 1 wherein the alignment plate comprises an alignment portion and a mating force application portion.

14. The apparatus of claim 13 wherein the alignment portion includes a plurality of holes therein to receive the packaging caps, and the force application portion includes a corresponding plurality of depressions having force elements therein to apply a force to the packaging caps.

15. The apparatus of claim 1, further comprising an oven within which the alignment plate, the force mechanism and the substrate are inserted and heated to adhere the packaging caps to the substrate.

16. The apparatus of claim 15 wherein the oven comprises a conventional thermal, an autoclave, a microwave oven, ultraviolet (UV) oven, or an infrared oven.

17. A system comprising
an alignment plate having a plurality of depressions separated from each other by interstitial portions of the alignment plate, each depression being sized to receive a packaging cap therein and to prevent movement of the packaging cap;
a force applicator to press the alignment plate together with a substantially rigid substrate having a plurality of devices mounted thereon such that the packaging caps and the interstitial portions of the alignment plate are in contact with the substrate and such that each packaging cap encloses a corresponding device mounted on the substrate; and
an oven within which the alignment plate, the force mechanism and the substrate are inserted and heated to adhere the packaging caps to the substrate.

18. The system of claim 17 wherein the force applicator comprises a cover plate.

19. The system of claim 17 wherein the force applicator comprises the alignment plate.

20. The system of claim 17 wherein the force applicator comprises:
- a sealing plate positioned within a sealing ring and forming an airtight seal therewith, the sealing ring being positioned around a perimeter of the alignment plate, and the substrate being sandwiched between the sealing plate and the alignment plate; and
- a vacuum pump to evacuate air from between the sealing plate and the alignment plate.

21. The system of claim 17 wherein the force applicator applies a force dependent on a deflection of the packaging caps.

22. The system of claim 21 wherein the force applicator comprises a plurality of springs positioned in the depressions.

23. The system of claim 17 wherein the force applicator applies a temperature-dependent force.

24. The system of claim 23 wherein the force applicator comprises a plurality of expansion elements positioned in the plurality of depressions, each expansion element having a coefficient of thermal expansion selected to apply a net force to the packaging cap when heated.

25. The apparatus of claim 17 wherein the alignment plate comprises an alignment portion and a mating force application portion.

26. The apparatus of claim 25 wherein the alignment portion includes a plurality of holes therein to receive the packaging caps, and the force application portion includes a corresponding plurality of depressions having force elements therein to apply a force to the packaging caps.

27. The apparatus of claim 17 wherein the oven comprises a conventional thermal, an autoclave, a microwave oven, ultraviolet (UV) oven, or an infrared oven.

* * * * *